US 8,882,913 B2

(12) United States Patent
Byun et al.

(10) Patent No.: US 8,882,913 B2
(45) Date of Patent: Nov. 11, 2014

(54) APPARATUS OF CHEMICAL VAPOR DEPOSITION WITH A SHOWERHEAD REGULATING INJECTION VELOCITY OF REACTIVE GASES POSITIVELY AND METHOD THEREOF

(75) Inventors: Chul Soo Byun, Seoul (KR); Man Cheol Han, Seoul (KR)

(73) Assignees: Piezonics Co., Ltd (KR); Korea Institute of Industrial Technology (KR)

( * ) Notice: Subject to any disclaimer, the term of this patent is extended or adjusted under 35 U.S.C. 154(b) by 1264 days.

(21) Appl. No.: 12/089,695

(22) PCT Filed: Feb. 16, 2007

(86) PCT No.: PCT/KR2007/000832
§ 371 (c)(1),
(2), (4) Date: Jun. 2, 2008

(87) PCT Pub. No.: WO2008/032910
PCT Pub. Date: Mar. 20, 2008

(65) Prior Publication Data
US 2009/0169744 A1  Jul. 2, 2009

(30) Foreign Application Priority Data
Sep. 16, 2006 (KR) .................. 10-2006-0089853
Dec. 8, 2006 (KR) .................. 10-2006-0124928
Jan. 29, 2007 (KR) .................. 10-2007-0008668

(51) Int. Cl.
C23C 16/455  (2006.01)
C23C 16/40  (2006.01)
C23C 16/00  (2006.01)
H01L 21/67  (2006.01)

(52) U.S. Cl.
CPC ..... *C23C 16/45565* (2013.01); *C23C 16/45572* (2013.01); *C23C 16/45514* (2013.01); *H01L 21/67069* (2013.01); *C23C 16/40* (2013.01); *C23C 16/45574* (2013.01)
USPC .. 118/715; 118/724; 156/345.33; 156/345.34

(58) Field of Classification Search
CPC .................. C23C 16/45565; C23C 16/45574; C23C 16/45514; C23C 16/45572; C23C 16/40; C23C 16/45578; H01L 21/67069
USPC ................ 118/715, 724; 156/345.33, 345.34
See application file for complete search history.

(56) References Cited

U.S. PATENT DOCUMENTS
3,381,114 A * 4/1968 Nakanuma .................... 219/385
(Continued)

FOREIGN PATENT DOCUMENTS
JP  2005-129712  5/2005
(Continued)

OTHER PUBLICATIONS
U.S. Appl. No. 12/351,540, Byun.
(Continued)

*Primary Examiner* — Jeffrie R Lund
(74) *Attorney, Agent, or Firm* — Park & Associates IP Law, P.C.

(57) ABSTRACT

The present invention is related to an apparatus and a method for chemical vapor deposition (CVD) using a showerhead through which a reactive gas of at least one kind and a purge gas is injected over a substrate on which a film is growing. A plural number of reactive gas showerhead modules are laid on a purge gas showerhead module. Each reactive gas is injected from a bottom of the showerhead after flowing through the showerhead as separated, thereby preventing the reactive gases from causing homogeneous gas phase reactions and from generating unwanted particles at the inside of the showerhead. And a purge gas is injected from the bottom surface of the showerhead by forming a protective curtain, thereby suppressing diffusion of the reactive gas injected backwardly. Each reactive gas is mixed with an injection support gas which is a kind of inert gas in a mixing zone at inside of the showerhead, where the injection velocity of each reactive gas is regulated positively by the amount of the injection support gas mixed. The present invention further includes an apparatus and a method, wherein the showerhead is cooled by a cooling jacket which keeps the temperature of the showerhead at proper levels to prevent both the condensation and the thermal decomposition of the reactive gas used.

8 Claims, 14 Drawing Sheets

(56) References Cited

U.S. PATENT DOCUMENTS

| | | | | |
|---|---|---|---|---|
| 4,584,206 A * | 4/1986 | Sleighter | | 427/109 |
| 4,717,049 A * | 1/1988 | Green et al. | | 222/420 |
| 4,767,641 A * | 8/1988 | Kieser et al. | | 427/569 |
| 4,900,411 A * | 2/1990 | Poong et al. | | 204/157.43 |
| 5,006,192 A * | 4/1991 | Deguchi | | 156/345.44 |
| 5,192,370 A * | 3/1993 | Oda et al. | | 118/723 R |
| 5,324,360 A * | 6/1994 | Kozuka | | 118/719 |
| 5,556,476 A | 9/1996 | Lei et al. | | |
| 5,571,332 A * | 11/1996 | Halpern | | 118/723 HC |
| 5,647,912 A * | 7/1997 | Kaminishizono et al. | | 118/719 |
| 5,772,771 A * | 6/1998 | Li et al. | | 118/723 I |
| 5,935,336 A * | 8/1999 | Sandhu et al. | | 118/723 IR |
| 5,950,925 A * | 9/1999 | Fukunaga et al. | | 239/132.3 |
| 5,958,140 A * | 9/1999 | Arami et al. | | 118/725 |
| 6,086,677 A * | 7/2000 | Umotoy et al. | | 118/715 |
| 6,089,472 A | 7/2000 | Carter | | |
| 6,090,210 A * | 7/2000 | Ballance et al. | | 118/725 |
| 6,113,705 A * | 9/2000 | Ohashi et al. | | 118/730 |
| 6,143,081 A | 11/2000 | Shinriki et al. | | |
| 6,143,082 A | 11/2000 | McInerney et al. | | |
| 6,187,214 B1 * | 2/2001 | Ganan-Calvo | | 216/92 |
| 6,221,166 B1 | 4/2001 | Nguyen et al. | | |
| 6,302,964 B1 * | 10/2001 | Umotoy et al. | | 118/715 |
| 6,435,428 B2 * | 8/2002 | Kim et al. | | 239/553 |
| 6,436,193 B1 | 8/2002 | Kasai et al. | | |
| 6,478,872 B1 | 11/2002 | Chae et al. | | |
| 6,508,197 B1 * | 1/2003 | Omstead et al. | | 118/715 |
| 6,544,341 B1 * | 4/2003 | Omstead et al. | | 118/729 |
| 6,623,656 B2 | 9/2003 | Baum et al. | | |
| 6,626,998 B1 | 9/2003 | Dunham | | |
| 6,631,692 B1 | 10/2003 | Matsuki et al. | | |
| 6,692,575 B1 * | 2/2004 | Omstead et al. | | 118/728 |
| 6,800,139 B1 * | 10/2004 | Shinriki et al. | | 118/715 |
| 6,886,491 B2 * | 5/2005 | Kim et al. | | 118/723 E |
| 7,018,940 B2 | 3/2006 | Dunham | | |
| 7,156,921 B2 | 1/2007 | Byun | | |
| 7,229,666 B2 | 6/2007 | Mardian et al. | | |
| 7,410,676 B2 * | 8/2008 | Kim et al. | | 427/569 |
| 7,479,303 B2 * | 1/2009 | Byun | | 427/248.1 |
| 7,651,568 B2 * | 1/2010 | Ishizaka et al. | | 118/715 |
| 7,674,352 B2 * | 3/2010 | Bour et al. | | 156/345.34 |
| 7,931,749 B2 * | 4/2011 | Amikura et al. | | 118/715 |
| 7,976,631 B2 * | 7/2011 | Burrows et al. | | 118/715 |
| 8,298,370 B2 * | 10/2012 | Byun | | 156/345.34 |
| 8,361,892 B2 * | 1/2013 | Tam et al. | | 438/507 |
| 8,679,956 B2 * | 3/2014 | Tam et al. | | 438/507 |
| 2001/0042799 A1 * | 11/2001 | Kim et al. | | 239/553 |
| 2002/0129769 A1 | 9/2002 | Kim et al. | | |
| 2003/0077388 A1 | 4/2003 | Byun | | |
| 2003/0097987 A1 | 5/2003 | Fukuda | | |
| 2005/0092248 A1 * | 5/2005 | Lee et al. | | 118/715 |
| 2005/0217582 A1 * | 10/2005 | Kim et al. | | 118/723 E |
| 2006/0263522 A1 | 11/2006 | Byun et al. | | |
| 2007/0148349 A1 * | 6/2007 | Fukada | | 427/248.1 |
| 2007/0163440 A1 * | 7/2007 | Kim et al. | | 96/52 |
| 2007/0272154 A1 * | 11/2007 | Amikura et al. | | 118/719 |
| 2009/0169744 A1 * | 7/2009 | Byun et al. | | 427/255.28 |
| 2009/0178616 A1 * | 7/2009 | Byun | | 118/715 |
| 2011/0052833 A1 * | 3/2011 | Hanawa et al. | | 427/534 |
| 2011/0073038 A1 * | 3/2011 | Chien et al. | | 118/715 |
| 2011/0253044 A1 * | 10/2011 | Tam et al. | | 118/666 |
| 2011/0256315 A1 * | 10/2011 | Tam et al. | | 427/255.28 |
| 2011/0256645 A1 * | 10/2011 | Tam et al. | | 438/14 |
| 2011/0256692 A1 * | 10/2011 | Tam et al. | | 438/478 |
| 2012/0052216 A1 * | 3/2012 | Hanawa et al. | | 427/582 |
| 2012/0067971 A1 * | 3/2012 | Byun et al. | | 239/106 |
| 2012/0234945 A1 * | 9/2012 | Olgado | | 239/589 |
| 2013/0298835 A1 * | 11/2013 | Tam et al. | | 118/728 |

FOREIGN PATENT DOCUMENTS

| | | |
|---|---|---|
| WO | WO 2005/041285 A1 * | 5/2005 |
| WO | WO2005041285 | 5/2005 |
| WO | WO 2005041285 A1 * | 5/2005 |
| WO | WO2005041285 | 6/2005 |

OTHER PUBLICATIONS

International Preliminary Report on Patentability for International (PCT) Application No. PCT/KR2007/000832, issued Mar. 17, 2009.
International Search Report prepared by the Korean Intellectual Property Office on Jun. 4, 2007 for International Application No. PCT/KR2007/000832; Applicant, Piezonics Co. Ltd.
Written Opinion prepared by the Korean Intellectual Property Office on Jun. 4, 2007 for International Application No. PCT/KR2007/000832; Applicant, Piezonics Co. Ltd.
Tripathi, et al., "Comparison of the Applications of Process Simulations and FMEA: Two Case Studies", IEEE/SEMI Advanced Semiconductor Manufacturing Conference, 1994, pp. 140-143.

* cited by examiner

APPARATUS OF CHEMICAL VAPOR DEPOSITION WITH A SHOWERHEAD REGULATING INJECTION VELOCITY OF REACTIVE GASES POSITIVELY AND METHOD THEREOF

CROSS REFERENCE TO RELATED APPLICATIONS

This application is a national stage application under 35 U.S.C. 371 of PCT Application No. PCT/KR2007/000832 having an international filing date of 16 Feb. 2007, which designated the United States, which PCT application claimed the benefit of Korea Application Nos. 10-2006-0089853 filed 16 Sep. 2006, 10-2006-0124928filed 8 Dec. 2006, and 10-2007-0008668 filed 29 Jan. 2007, the entire disclosure of each of which are hereby incorporated herein by reference.

TECHNICAL FIELD

The present invention relates to an apparatus and a method for chemical vapor deposition (CVD) with a showerhead which supplies a plural kind of reactive gases and a purge gas over a substrate to grow a film on the substrate uniformly in thickness and composition. Here, the present invention is associated with U.S. Pat. No. 7,156,921 ("Method and apparatus for chemical vapor deposition capable of preventing contamination and enhancing film growth rate", filed on Oct. 9, 2002), the entire contents of which are hereby incorporated by reference.

BACKGROUND ART

In an apparatus for chemical vapor deposition (CVD), a reactive gas is introduced into a vacuum reaction chamber, flows through a showerhead, and reaches a susceptor or a substrate holder on which a substrate is located. The reactive gas causes chemical reaction on the substrate to form a desired film. As a means to provide energy necessary to induce chemical reactions on the substrate, a method of simply heating the substrate or atomically exciting the reactive gas, such as making plasma, is widely used. After the reaction is finished, byproduct gases are removed from the reaction chamber by an exhaust system including a vacuum pump, then, passing through a purifying system, finally, being discharged into the atmosphere. However, since it is very important to prevent undesired particle deposition on a wall of the reaction chamber or the showerhead during a deposition process, it is preferable that the reactive gases do not react each other in a gaseous state. Unfortunately, if reactive gases whose decomposition temperature are substantially lower than 200° C. like metal- organic compounds are mixed in the reaction chamber, the mixture may cause homogeneous reactions in the gas phase leading to a generation of contaminant particles, or cause heterogeneous reactions on a solid-state surface such as a showerhead surface or a reaction chamber wall. Particularly, it may happen that the reactive gas is sensitive to a specific material. For example, zirconium tert-butoxide ($Zr(OC_4H_9)_4$) is extremely sensitive to moisture, which is strongly like to form zirconium hydroxide ($Zr(OH)_x$) of white powder type. The moisture could have been physically adsorbed on the inner side of the reaction chamber, but it may be also generated over the substrates as a byproduct gas. Then, the moisture reacts with ($Zr(OC_4H_9)_4$) on the inner wall of the reaction chamber or the surface of the showerhead, depositing zirconium hydroxides. The unwanted deposits are eventually flaked off into fine particles due to a repeated thermal expansion and contraction and/or a lattice parameter mismatch between the surface materials and the deposits. As a result of this, the film formed on the substrate may be contaminated and the productivity becomes deteriorated due to a shortened preventative maintenance cycle time to remove the unwanted deposits.

When a highly integrated semiconductor is manufactured, contaminant particles may cause a pattern defect such as a short or disconnection between lines, and the size of the contaminant particle influencing yield is in proportion to the line width. Therefore, as the line size becomes smaller, that is, as the density of the integration is increased, the size of particle influencing yield becomes smaller, whereby the number of contaminant particles to be permitted in the reaction chamber is more seriously limited.

FIG. 1 is a brief sectional view of a showerhead of a prior art, U.S. Pat. No. 6,626,998, wherein a plural number of reactive gases flow through without being mixed and are injected over a substrate so as to prevent reactions between the reactive gases therein. As each reactive gas is supplied to the first ring type individual channels 23 through a plurality of gas supply passages 17, the gases are diffused in the first individual channels 23, and then, transmitted to the second ring type individual channels 27 through a plurality of transition passages 25 formed at the bottom of each channel. After being diffused in the second channels 27, the reactive gases are supplied over a substrate through a plurality of second gas transition passages 31 which are formed at the bottom of the second channels. The reactive gases cause chemical reaction on the substrate (not shown) placed on a susceptor keeping temperature of the substrate higher than that of surroundings to form a desired film on the substrate.

FIG. 2 is a brief sectional view of a prior art showerhead as described in JP2005-129712. The 1st purge gas injection holes 10b surround the reactive gas injection holes 10a and the 2nd purge gas injection holes 10c are arranged by proper intervals between the 1st purge gas injection holes 10b. In this configuration unwanted film deposition at the bottom of the showerhead would be suppressed by the work of the 1st and 2nd purge gases used.

DISCLOSURE OF INVENTION

Technical Problem

However, provided not with adequate means, a reactive gas such as metal-organic compound gas having a low decomposition temperature or sensitive to moisture may cause unwanted deposits at the bottom of the showerhead. In the prior art of FIG. 1, the reactive gas injected from the bottom of the showerhead may diffuse backwardly and make a contamination at the bottom of the showerhead.

In the prior art of FIG. 2, the injection velocity of the 1st purge gas and the 2nd purge gas are highly dependant on the ratio of the total sectional areas of the 1st and 2nd purge gas injection holes. In this regards it seems very difficult to positively and optimally control the injection velocities of the 1st and 2nd purge gas. And it is described that "post mixing", that is, mixing of a reactive gas and a purge gas at the space between the bottom of the showerhead and the substrate, is preferred rather than the "pre mixing", that is, mixing of a reactive gas and a purge gas at the stage before entering into the reaction chamber. However, in case that an inert gas is used as a purge gas, it is very difficult that the purge gas and the reactive gas cause chemical reactions within the showerhead. In this regards it should be reconsidered that "post mixing" is preferable in a CVD system. Moreover, the prior art in FIG. 2 does not mention about the case using a plural kind of reactive gases. If a plural kind of reactive gas is mixed previously and supplied into the shower head, there is a strong likelihood that particles are generated within the showerhead.

The behavior of the film growing on substrates is dominated by the mass transport of the reactive gas containing components of the film. The mass transport of reactive gases from the showerhead to the substrate is done via multiple paths including convection, diffusion, and thermo-phoresis. Among those, the convection is relatively easy to handle. It may be an effective solution to regulate the injection velocity of the reactive gases independently for meeting required composition and uniformity of the film. However, prior arts do not mention about the way to enhance the uniformity of the film growing on the substrate.

A necessity to form various kinds of films using various kind of reactive gas by CVD process has been increased. However, if the conventional showerhead device is used further, undesired particles may deposit in the showerhead due to the unexpected properties of the reactive gases used, or a good quality of the film grown on substrates may not be attained, which may limit the wide application of the CVD process.

Technical Solution

In the present invention there is provided an apparatus for chemical vapor deposition (CVD) with a showerhead and a method thereof, wherein each reactive gas is supplied to the substrate independently while passing through the showerhead, wherein a purge gas is injected from the bottom surface of the showerhead and forms a protective curtain, wherein the injection velocity of each kind of reactive gas is positively and externally regulated to make a uniform mixing of the reactive gases over the substrate, and wherein the showerhead is applied to a reactive gas confining means which surrounds the substrate and extended to the bottom of the reaction chamber at its one end.

A plural kind of reactive gases and injection support gases are supplied into the showerhead in such a way that each reactive gas is mixed with each injection support gas in a mixing zone at inside of the showerhead, and a purge gas is supplied into a compartment formed at inside of the showerhead. Then, the reactive gas mixed with the injection support gas and the purge gas are injected through a large number of reactive gas exits and a large number of purge gas exits formed at the bottom surface of the showerhead, respectively, thereby the injection velocities of each reactive gas and the purge gas are positively regulated.

The showerhead includes a plurality of reactive gas showerhead modules and a purge gas showerhead module separated each other, the number of the reactive gas showerhead modules is same as the number of kinds of reactive gases, and a large number of reactive gas injection tubes are connected to the bottom of a reactive gas shower head module for injecting a reactive gas mixed with an injection support gas which is a kind of a inert gas. A purge gas showerhead module, having a large number of guide tubes of which ends are hermetically joined at the holes formed at top and bottom plate of the purge gas showerhead module for accepting the reactive gas injection tubes along the inside thereof, is mounted under the reactive gas showerhead modules. A large number of exits are formed at the bottom of the purge gas showerhead module for injecting the purge gas. The guide tubes are also inserted to the reactive gas showerhead modules in such a way that reactive gas injection tubes connected to a reactive gas showerhead module at upper position passes through a reactive gas showerhead modules at lower position along the inside of the guide tube of the lower reactive gas showerhead module.

A cooling jacket constitutes the lowest part of the showerhead by keeping the temperature of the showerhead at proper levels to suppress both condensation and thermal decomposition of the reactive gas in the showerhead.

Advantageous Effects

As described above the present invention has a function that each reactive gas passes through a showerhead independently, thereby preventing mixing of the reactive gases at inside of the showerhead. Moreover, the present invention has a function that a purge gas is injected from a bottom surface of the showerhead and forms a protective curtain beneath the bottom of the showerhead, thereby suppressing diffusion of the reactive gas backwardly. Moreover, the present invention has a function that the injection velocity of each reactive gas is positively regulated by controlling the amount of the injection support gas which is mixed to the reactive gas in the showerhead, thereby determining composition of the film growing on substrates easily. Furthermore, the present invention has a function that the temperature of showerhead is maintained at proper levels by mounting a cooling jacket which constitutes the lowest part of the showerhead, thereby unwanted film deposition caused by thermal decomposition of the reactive gases is suppressed at inside and bottom of the showerhead. In addition to this, if the present invention is applied to a CVD system together with a reactive gas confining means, the contamination at inside of the reactive gas confining means is prevented, and the film growth rate is increased by confining the reactive gas in the vicinity of the substrates.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

BRIEF DESCRIPTION OF THE DRAWINGS

The above and other objects, features and advantages of the present invention will be apparent from the following detailed description of the preferred embodiments of the invention in conjunction with the accompanying drawings, in which.

BEST MODE FOR CARRYING OUT THE INVENTION

The purge gas in the present invention doesn't either dissolve or generate byproducts by itself. For example, the purge gas includes Ar, $N_2$, and He. If no chemical reactions are induced in the showerhead, $H_2$ or $O_2$ may be included as a purge gas and may participate in the deposition process on substrates as a source material. The purge gas, having a relatively small molecular weight, diffuses instantly in the reaction chamber and is relatively less influenced by a force circulation caused by the act of vacuum pump.

Meanwhile, the reactive gas is a source material gas that participates directly in the deposition process on substrates by pyrolysis, combination, and/or etc., for example, a gaseous source material containing components of the film deposited, a mixture of a vaporized source material containing components of the film deposited and a carrier gas for vaporizing, or a purely vaporized source material containing components of the film deposited without the aid of carrier gas. The source material includes, for example, $Pb(C_2H_5)_4$ for Pb, $Zr(OC_4H_9)_4$ for Zr, and $Ti(OC_3H_7)_4$ for Ti, which are all metal-organic compounds in the deposition of PZT (Lead Zirconium-Titanate) films. The carrier gas includes, for example, Ar, $N_2$, He, $H_2$ and etc. The reactive gas causes adsorption and surface reaction on all of the inner structure of the reaction chamber including substrates, reaction chamber inner wall, and the showerhead. The injection support gas is a kind of an inert gas, such as Ar, $N_2$, or $H_2$. If no chemical reactions are induced in the showerhead, $H_2$ or $O_2$ may be included as an injection support gas too.

Figure 1:
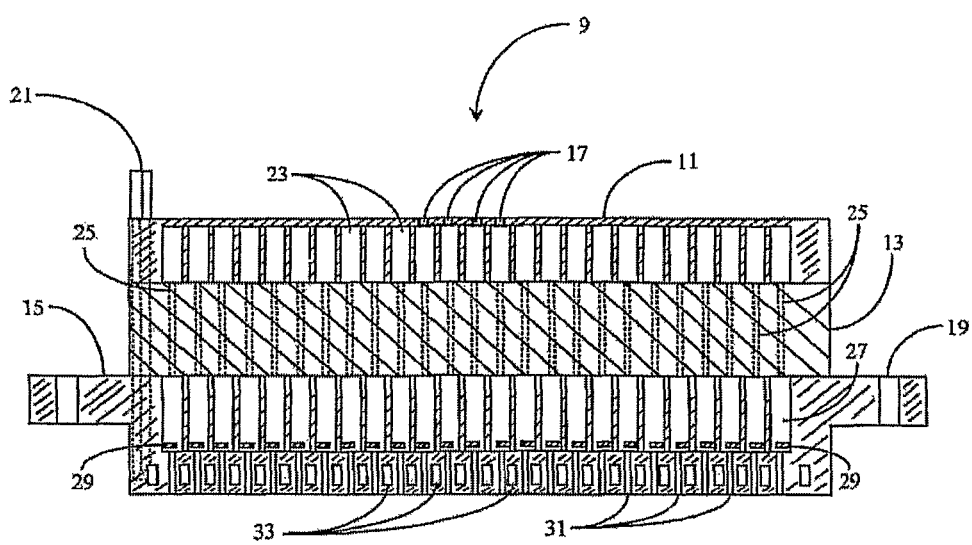
FIG. 1 is a brief sectional view showing a conventional showerhead which guides and injects different kinds of reactive gases to the substrate.
Figure 2:
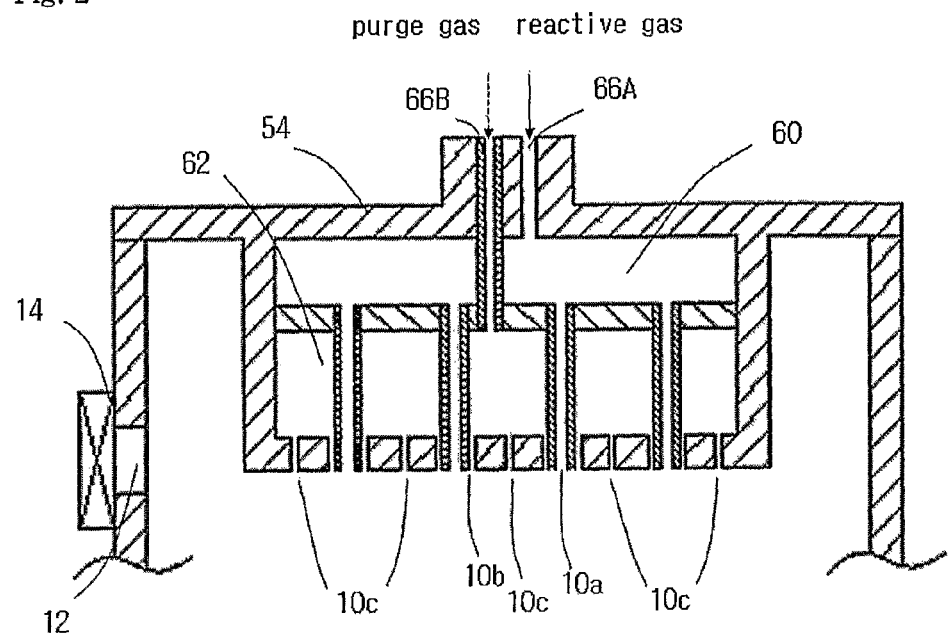
FIG. 2 is a brief sectional view showing a conventional showerhead capable of preventing unwanted film deposition at the bottom thereof in case that one reactive gas is used.
Figure 3:
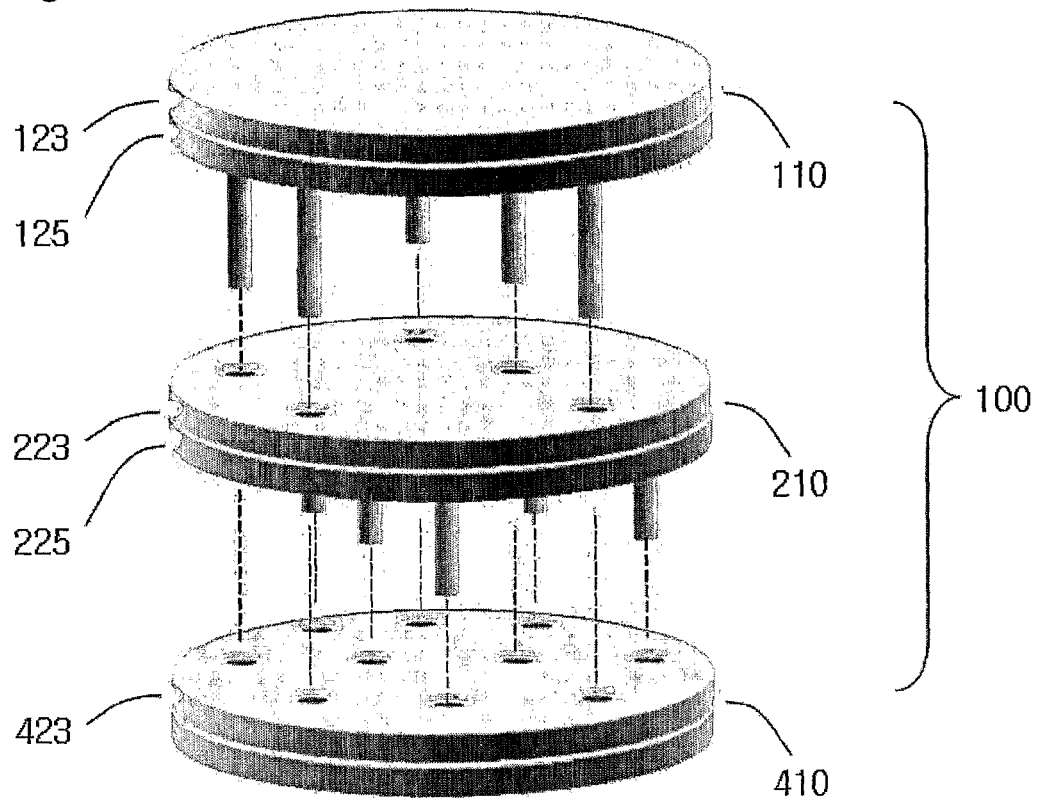
FIG. 3 is an perspective view of a showerhead of a first embodiment according to the present invention illustrating that a plurality of reactive gas showerhead modules and a purge gas showerhead module are vertically laid in an order.

FIGS. 3 to 6 show a first embodiment of the present invention. As shown in FIG. 3 two reactive gas showerhead modules and one purge gas showerhead module are vertically laid in an order. If more than two kinds of reactive gases are used, the number of the reactive gas showerhead modules may be 3, 4, or larger.

Figure 4:
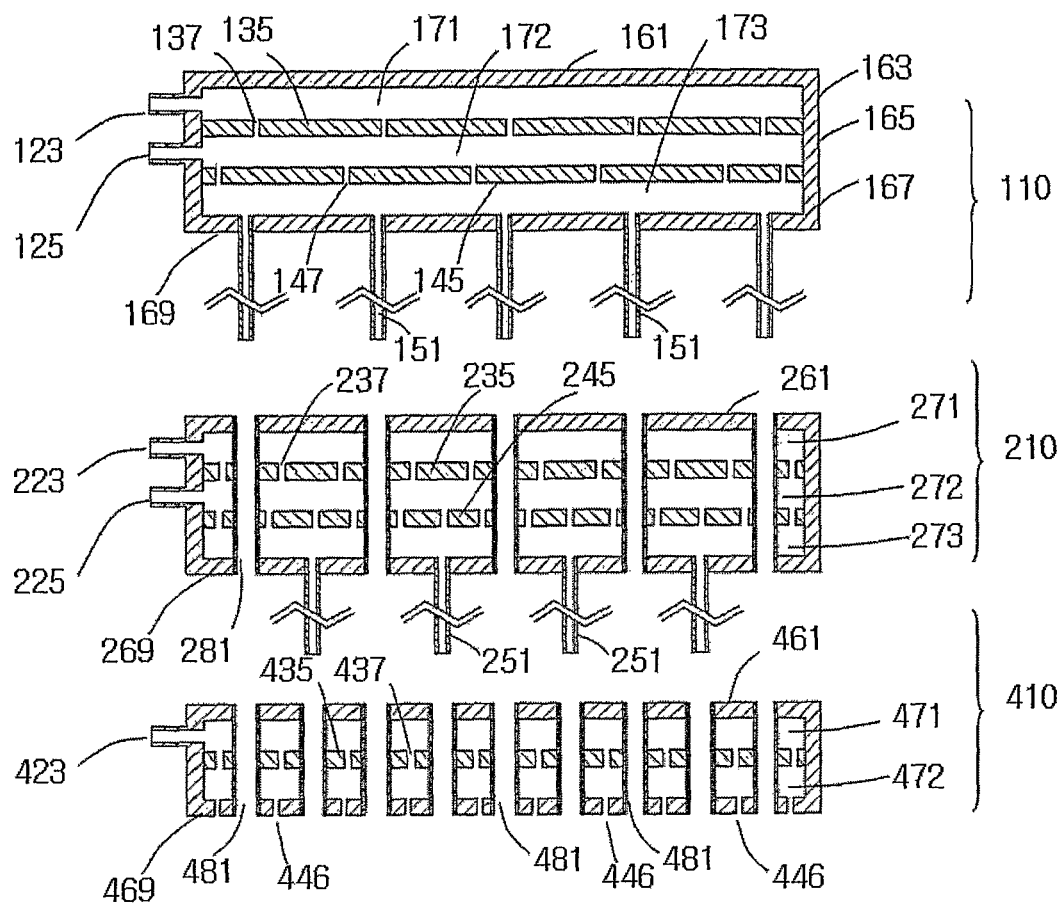
FIG. 4 is a sectional view of a showerhead of a first embodiment wherein the mixing of a reactive gas and an injection support gas occurs in a compartment thereof.

As shown in FIG. 4, a reactive gas and an injection support gas are respectively introduced into a diffusion room 171 and a mixing room 172 of the upper reactive gas showerhead module 110 along a reactive gas inlet 123 and an injection support gas inlet 125, respectively. The diffusion room 171 consists of a top plate 161, an upper wall 163, and an upper diaphragm 135, wherein the reactive gas delivered along the reactive gas inlet 123 is diffused. Then, the reactive gas is delivered into the mixing room 172 through a large number of holes 137 of the upper diaphragm 135. The mixing room 172 consists of the said upper diaphragm 135, a middle wall 165, and a lower diaphragm 145, wherein the injection support gas delivered along the injection support gas inlet 125 is mixed with the reactive gas delivered from the said diffusion room 171 via holes 137 at the upper diaphragm 135. The mixture of the reactive gas and the injection support gas is delivered into a distribution room 173 through a large number of holes 147 perforated at the lower diaphragm 145. The distribution room 173 consists of the said lower diaphragm 145, a lower wall 167, and a bottom 169, wherein the mixture of the reactive gas and the injection support gas delivered from the said mixing room 172 is equally distributed to a large number of reactive gas injection tubes 151 joined hermetically to holes of the bottom 169 thereof. In FIG. 4 it is preferable that the holes 137 of the upper diaphragm 135 and holes 147 of the lower diaphragm 145 are small enough to induce a uniform mixing in the mixing room 172, for example, 0.3 to 0.6 mm in diameter. The reactive gas injection tube 151 would be extended a rather long distance, about 60 to 120 mm. In this regards, the inner diameter of the reactive gas injection tube 151 is recommended to be at least 1.5 mm.

Figure 5:
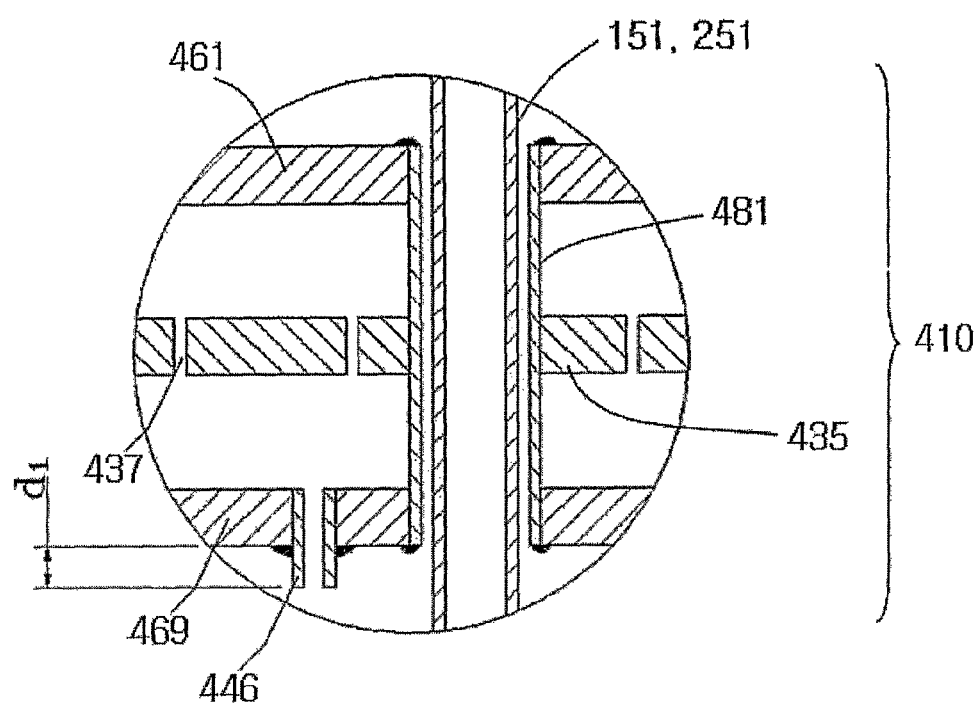
FIG. 5 is a detailed sectional view of a purge gas showerhead module showing purge gas exits and guide tubes of which end is hermetically joined to the bottom thereof.
Figure 6:
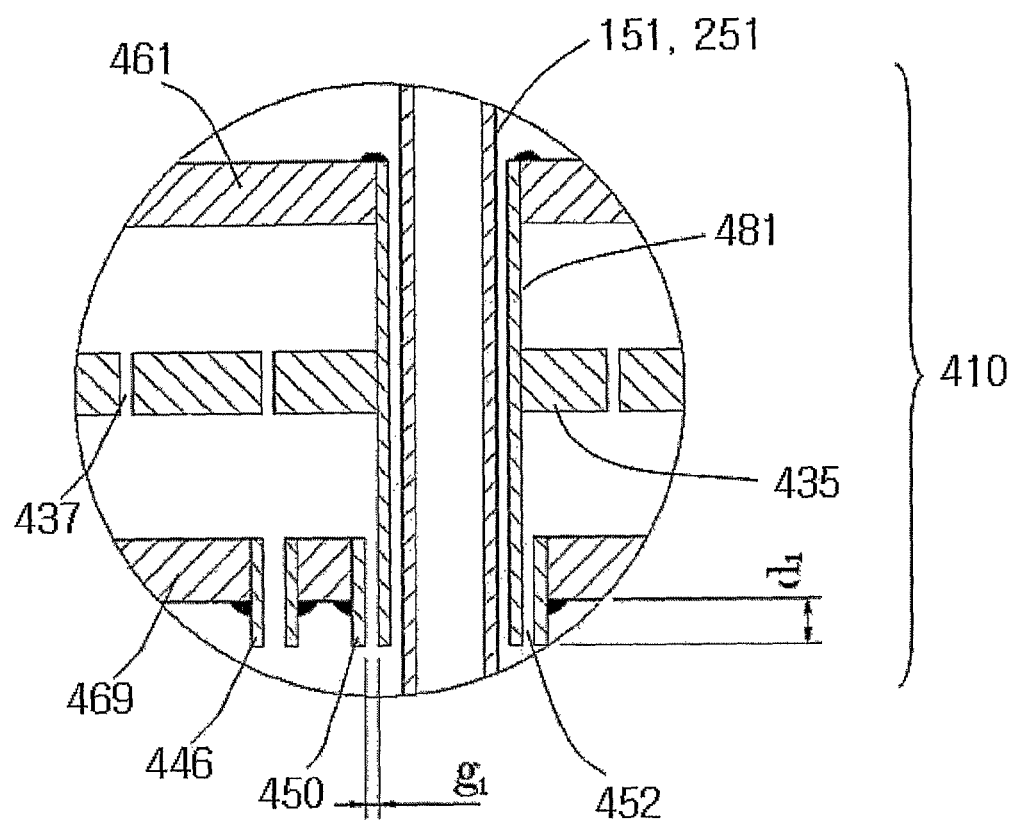
FIG. 6 is a detailed sectional view of a purge gas showerhead module showing a gap between the end of the guide tube and the hole at the bottom thereof.

Then, the reactive gas injection tube 151 passes through the lower reactive gas showerhead module 210 along a guide tube 281 of which ends are hermetically joined to holes formed at top 261 and bottom plate 269 of the lower reactive gas showerhead module 210. On the other hand, a purge gas is introduced into a purge gas showerhead module 410 through a purge gas inlet 423 thereof, sufficiently diffused at inside of the purge gas showerhead module 410 after flowing through a large number of holes 437 formed at the intermediate plate 435, and then, injected from the purge gas exits 446 which are located at the bottom 469 of the purge gas showerhead module 410. It is preferable that the size of the purge gas exit 446 is small enough to induce uniform distribution of the purge gas within the purge gas showerhead module, where the recommended size is 0.3 to 0.6mm in inner diameter. It may be necessary that the purge gas exit 446 is extended towards the substrate within a predetermined distance ("$d_1$" in FIG. 5), for example, 3mm. Finally, the reactive gas injection tubes 151 and 251 which are respectively extended from the reactive gas showerhead modules 110 and 210 pass through the purge gas showerhead module 410 along guide tubes 481, wherein the ends of the guide tube 481 are hermetically joined to the holes formed at top 461 and bottom plate 469 of the purge gas showerhead module 410 as shown in FIG. 5. If there exists a gap between the guide tube 481 and the hole 450 of the bottom 469 of the purge gas showerhead module 410, "$g_1$" in FIG. 6, an enhancement would be expected in the prevention of unwanted particle deposits at the tip of the reactive gas injection tubes 151 or 251. In this case, however, the structure becomes complicated and it is not easy to determine the injection velocity of the purge gas via the purge gas exits and the injection velocity of the purge gas via the gaps independently. Meanwhile, the inertia of the reactive gas injected from the end tip of the reactive gas injection tube would play more role in the prevention of the contamination at the tips rather than the effect of the purge gas injected from the gap. In this regards even if the gap does not exist and purge gas does not flow through the gap, it is expected that the contamination at the tip is not severe. However, the purge gas injected from the purge gas exit still plays an important role in making a protective curtain beneath the showerhead.

Figure 7:
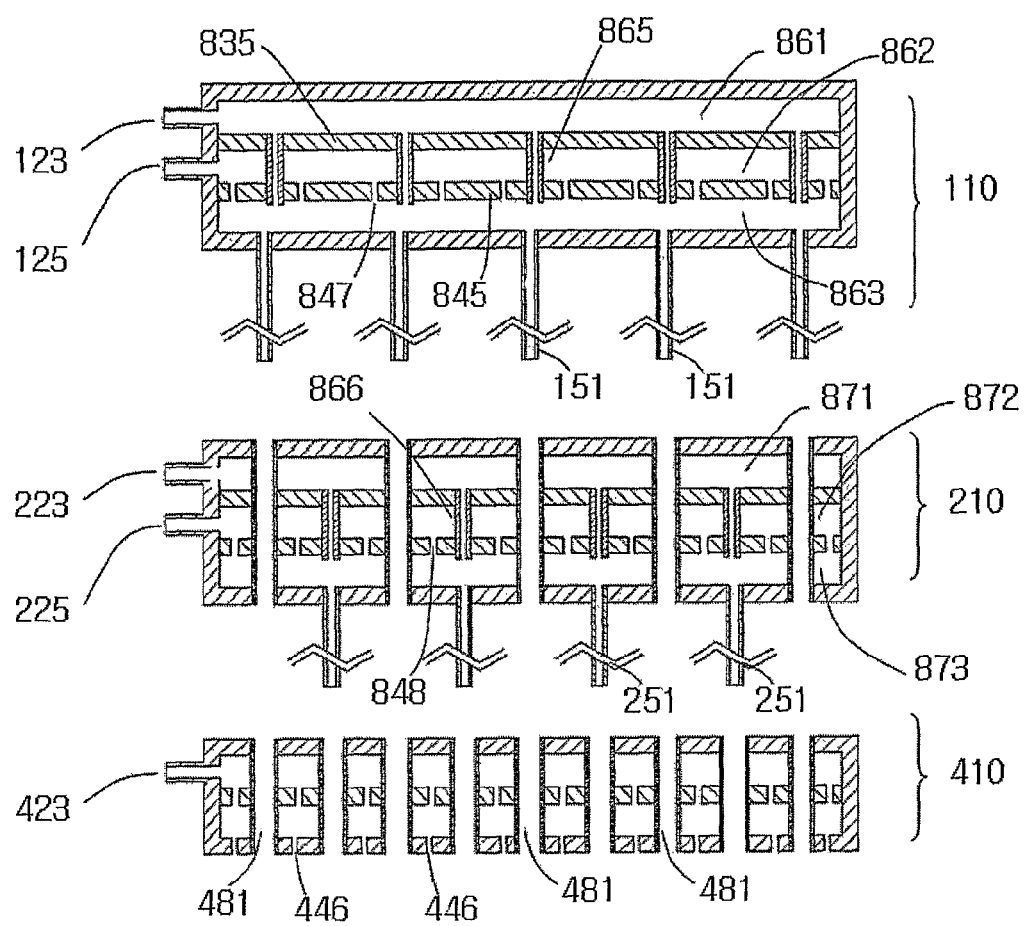
FIG. 7 is a sectional view of a showerhead of a second embodiment with an improved structure which promotes mixing of the reactive gas and the injection support gas.

FIG. 7 shows a second embodiment of the present invention, wherein a mixing of the reactive gas and the injection support gas is promoted within the reactive gas showerhead module. A reactive gas and an injection support gas are respectively introduced into a reactive gas diffusion room 861 and an injection support gas diffusion room 862 of the reactive gas showerhead module 110 along a reactive gas inlet 123 and an injection support gas inlet 125, respectively. The reactive gas passes through the injection support gas diffusion room 862 along a large number of reactive gas diffusion channels 865. It is required that one end of the reactive gas diffusion channel 865 is hermetically joined to the bottom 835 of the reactive gas diffusion room 862 so as to suppress the backward diffusion of the injection support gas to the reactive gas diffusion room 861. Laser welding technology would be used adequately in joining process. And it is recommended that there is no gap between the other end of the reactive gas diffusion channel 865 and the hole formed at bottom 845 of the injection support gas diffusion room 862 to suppress passage of the injection support gas along the gap. It is preferable that the number and the size of the reactive gas diffusion channels are between 0.2 to 0.4 per unit square cm and 0.8 to 1.6 mm in inner diameter, respectively. Instead, a large number of tiny holes 847, of about 0.3 to 0.6 mm in diameter, are formed at the bottom 845 of the injection support gas diffusion room 862 to assure a uniform injection of the injection support gas to the distribution room 863. Then, the reactive gas and the injection support gas are mixed in the distribution room 863 and distributed equally to the reactive gas injection tube 151.

Figure 8:
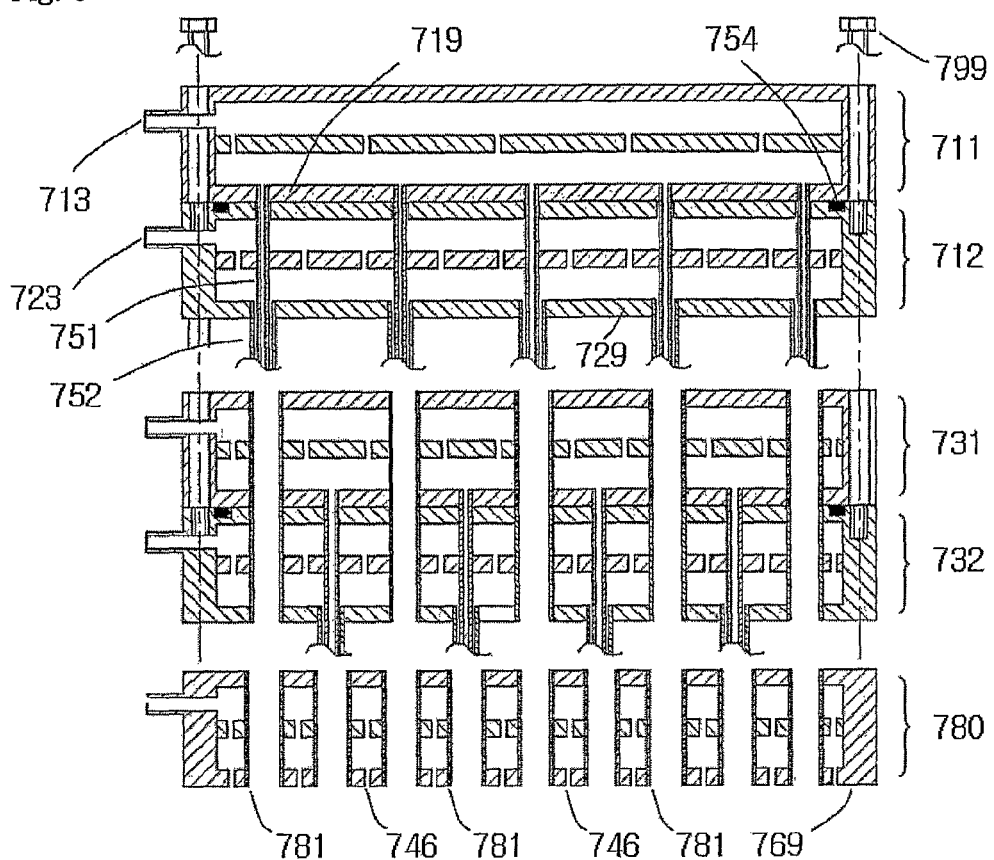
FIG. 8 is a sectional view of a showerhead of a third embodiment illustrating a plurality of reactive gas showerhead modules and a purge gas showerhead module which are vertically laid in an order, wherein mixing of a reactive gas and an injection support gas occurs at the exit part thereof.
Figure 9:
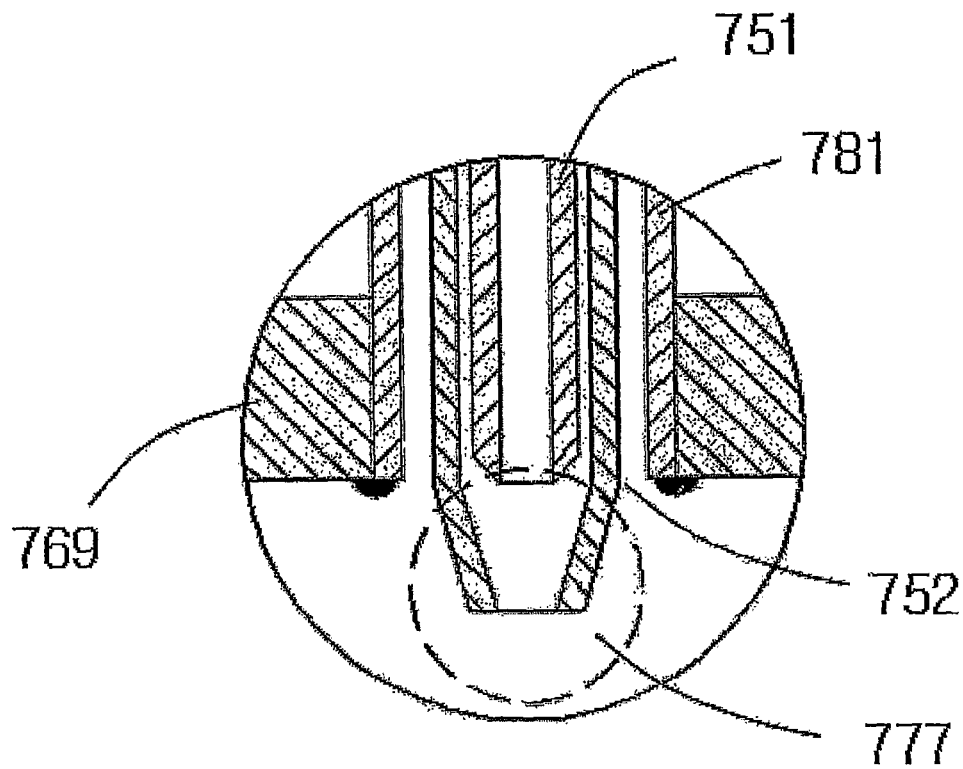
FIG. 9 is a detailed sectional view of a mixing zone of the third embodiment.

FIG. 8 shows a third embodiment of the present invention. The main difference of the third embodiment to the first or second embodiment is a location of a mixing zone in the showerhead. A reactive gas is entered into a reactive gas diffusion room 711 via a port 713 and equally distributed to a large number of inner reactive gas injection tubes 751 joined at the bottom 719 thereof. An injection support gas is entered into an injection support gas diffusion room 712 via a port 723 and is equally distributed to a large number of outer reactive gas injection tubes 752 joined at the bottom 729 thereof. As shown in FIG. 8, the inner reactive gas injection tube 751, surrounded by the outer reactive gas injection tube 752, is extended toward the substrate and passes through the purge gas showerhead module 780 along a guide tube 781. The inner reactive gas injection tube 751 is shorter than the outer reactive gas injection tube 752 by 5 to 10 mm at its end. The reactive gas diffusion room 711 and the injection support gas diffusion room 712 are hermetically tightened by an O-ring 754 and bolts 799. An inner reactive gas injection tube and an outer reactive gas channel constitutes a reactive gas injection tube as a pair, and the mixing of the reactive gas and the injection support gas occurs at a mixing zone 777 formed between the ends of the inner and outer reactive gas injection tubes as shown in FIG. 9.

Figure 10:
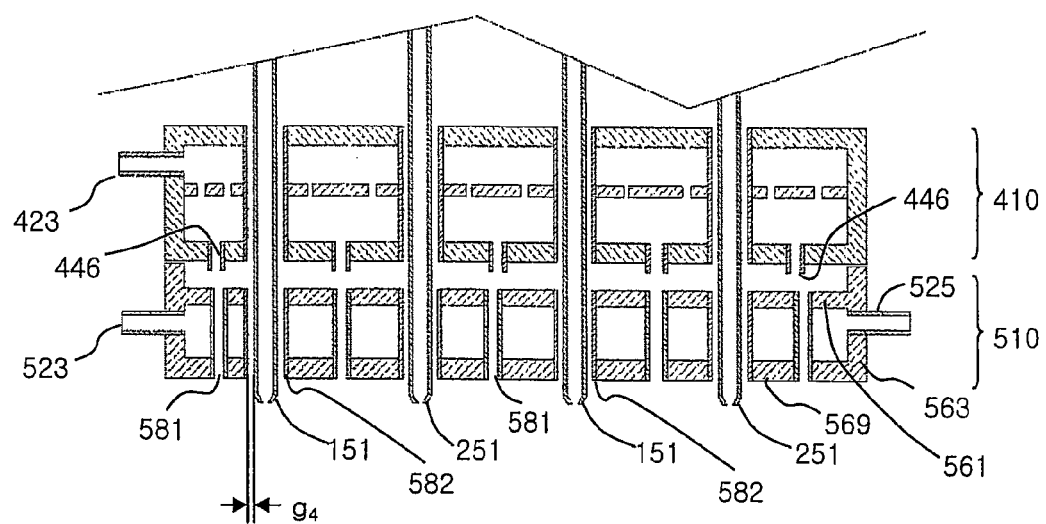
FIG. 10 is a sub-sectional view of a showerhead having a cooling jacket which is placed under the purge gas showerhead module and keeps the temperature of the showerhead at proper levels.

As shown in FIG. 10, a cooling jacket 510 is mounted under the purge gas showerhead module in the present invention. The cooling jacket 510 is composed of an upper plate 561, a wall 563, and a lower plate 569, wherein a plurality of guide tubes 582 for reactive gas injection tubes 151, 251 and a plurality of guide tubes 581 for the purge gas are hermetically joined to the upper plate 561 and the lower plate 569 at their ends. The purge gas injected from the purge gas showerhead module flows through the guide tube 581 and the annular gap ("g4") between the guide tube 582 and the reactive gas injection tube 151, then finally injected to the substrate (not shown). Therefore, as mentioned earlier in the description related with FIG. 6, the contamination is effectively prevented at the tip of the reactive gas injection tube 151 and 251 as well as at the bottom of the lower plate 569. The cooling jacket 510 has a function to keep temperature of the showerhead at proper levels, for example, at temperature of 150 ~200° C. A coolant supplied into the cooling jacket 510 via a coolant supply port 523 flows through the inner space of the cooling jacket 510, goes out of the cooling jacket 510 via an exit port 525, then finally goes out of the reaction chamber (not shown). The coolant may be a compressed air, water, or etc. However, it cannot be emphasized too much that there should be no leakage of the coolant to the reaction chamber. A thermocouple(not shown) may be mounted at any proper place of the surface of the showerhead to measure and control showerhead temperature. The detailed description will be omitted here, since the technology belongs to a general method. The effect of cooling the showerhead in the present invention is apparent in the prevention of unwanted film deposition in the showerhead and on the bottom surface of the purge gas showerhead module caused by thermal decomposition at unnecessarily high temperature.

Figure 11:
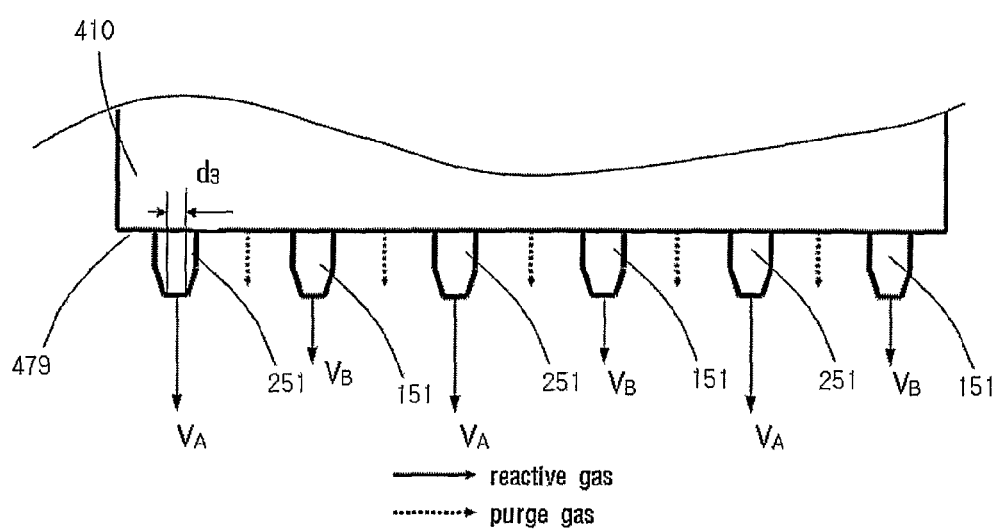
FIG. 11 is a schematic view showing magnitudes of injection velocities of a plurality of reactive gases and a purge gas at the bottom of the showerhead.

As shown in FIG. 11, in the present invention the mixture of the reactive gas and the injection support gas is injected from the end of the reactive gas injection tube 151 and 251 toward the substrate (not shown). It is preferable that the end tip of the reactive gas injection tube 151 and 251 has a shape of converging nozzle so as to easily assemble showerhead modules each other to enhance prevention of unwanted particle deposition at the bottom of the showerhead by increasing the injection velocity of the reactive gas. The inner diameter of the nozzle at the end, denoted by $d_3$ in FIG. 11, would be between 0.8 to 2 mm. If the end of the reactive gas injection tube 151 and 251 is extended from the bottom 479 of the showerhead 410 toward the substrate, the effect of the preventing unwanted particle deposition at the bottom of the showerhead would be increased, but the temperature at the end tip of the reactive gas injection tube 151 and 251 would rise much. In this regards the protrusion is recommended within 10 mm.

In case that a plurality of reactive gases is used, the injection velocity of each reactive gas can be positively regulated by the amount of injection support gas without influencing the delivering rate of the reactive gas. As shown in FIG. 11, the injection velocity of the reactive gas A, $V_A$, may be higher than that of reactive gas B, $V_B$. Therefore, the composition of films growing on substrates which is highly dependent on mass transport of each reactive gas can be more effectively determined. In addition to this, the flow rate of the purge gas via the purge gas exit 446 can be positively regulated too.

A kind of reactive gas does not mix with another kind of reactive gas until they are injected from the showerhead, then, every kind of reactive gases and the purge gas injected are mixed together at the space between the bottom surface 479 of the showerhead 410 and the substrate. It is preferred that the bottom surface 479 of the showerhead 410 is spaced apart to the substrate by 20 mm to 60 mm so as to achieve best compromise between the uniformity and the growth rate of films growing on substrates.

The number density of reactive gas injection tubes is directly related to the uniformity of the films on substrates.

Figure 12:
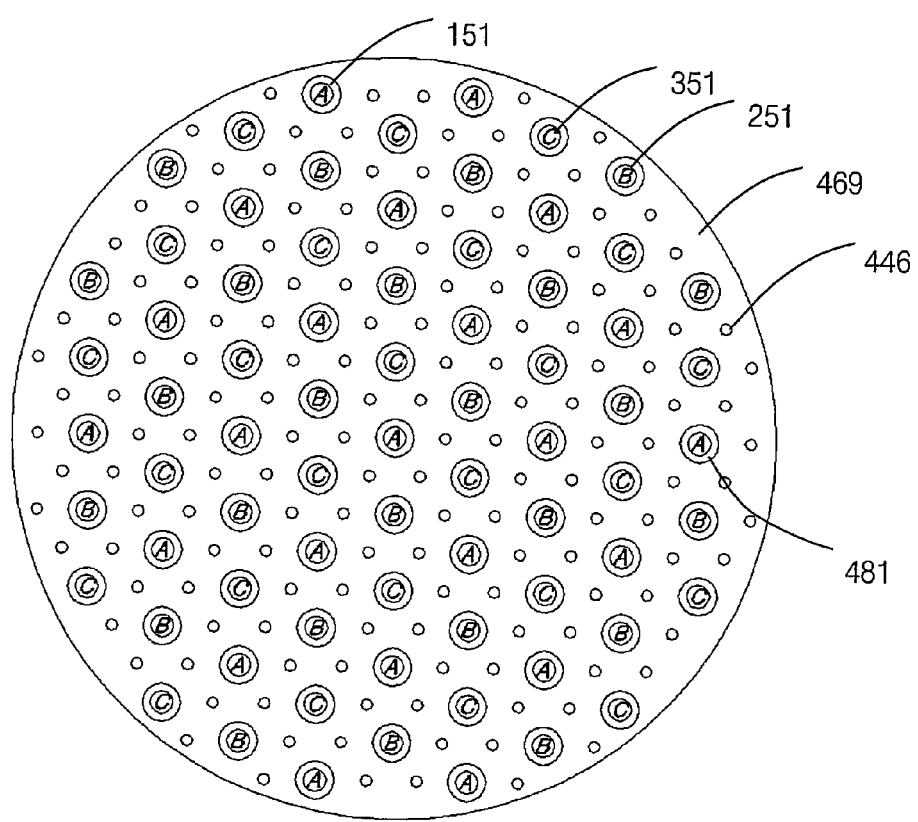
FIG. 12 is a bottom view showing an arrangement that rows and columns of the reactive gas injection tubes are crossed in a perpendicular direction and the two adjacent columns are shifted at a distance and staggered.
Figure 13:
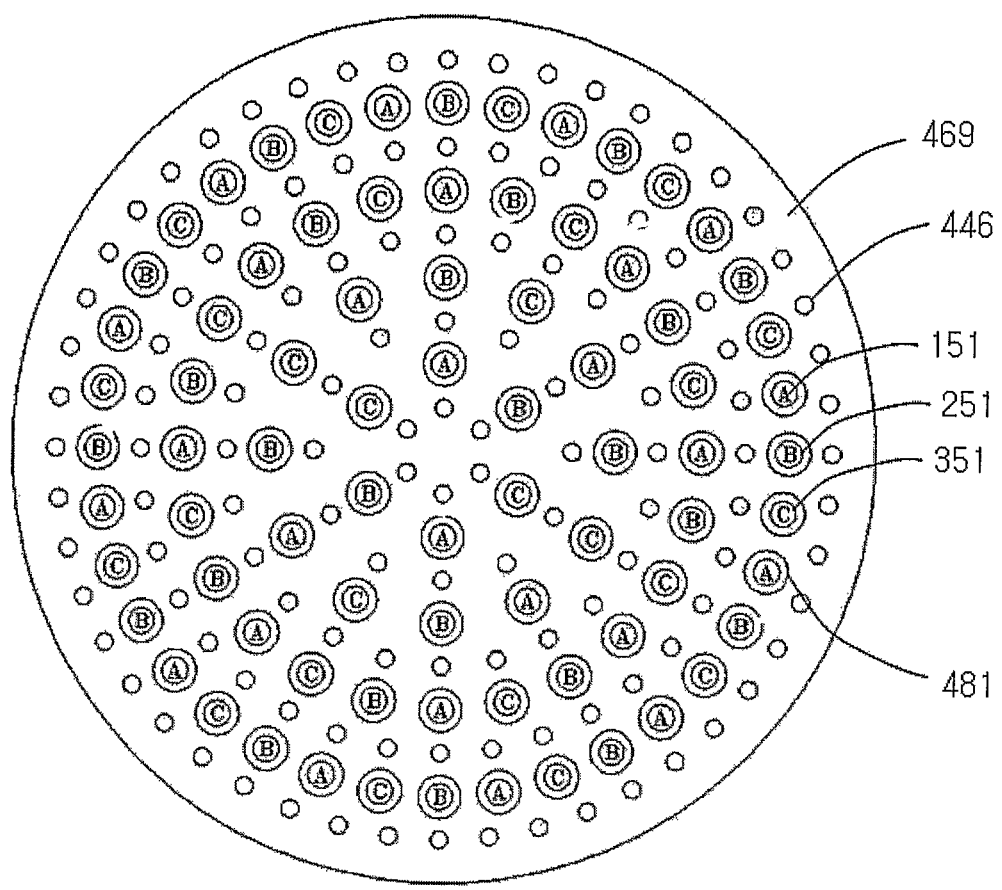
FIG. 13 is a bottom view showing an arrangement that locations of reactive gas injection tubes are repeated to multiple circumferential directions.

For one kind of reactive gas, the appropriate number density is about 0.2~0.4 per unit square cm. And the effective size of the bottom of the showerhead, that is the area where the reactive gas injection tubes are formed, would be large enough to cover the substrate. For the case of the substrate of 150 mm in diameter, the effective bottom size of the showerhead is about 200 mm in diameter, and the total number of the reactive gas injection tubes of one kind lies between 60 and 120. With regards to the arrangement of the reactive gas injection tubes, if the arrangement could assure a uniform spreading of the reactive gas, it would have any specific pattern or even randomness. Considering that three reactive gases are used, which are denoted as "A", "B", and "C", respectively, FIG. 12 is a bottom view showing an arrangement that rows and columns of the reactive gas injection tubes are crossed in a perpendicular direction and the two adjacent columns are shifted at a distance and staggered. FIG. 13 is a bottom view showing an arrangement that locations of reactive gas injection tubes are repeated to multiple circumferential directions.

EXAMPLE 1

Figure 14:
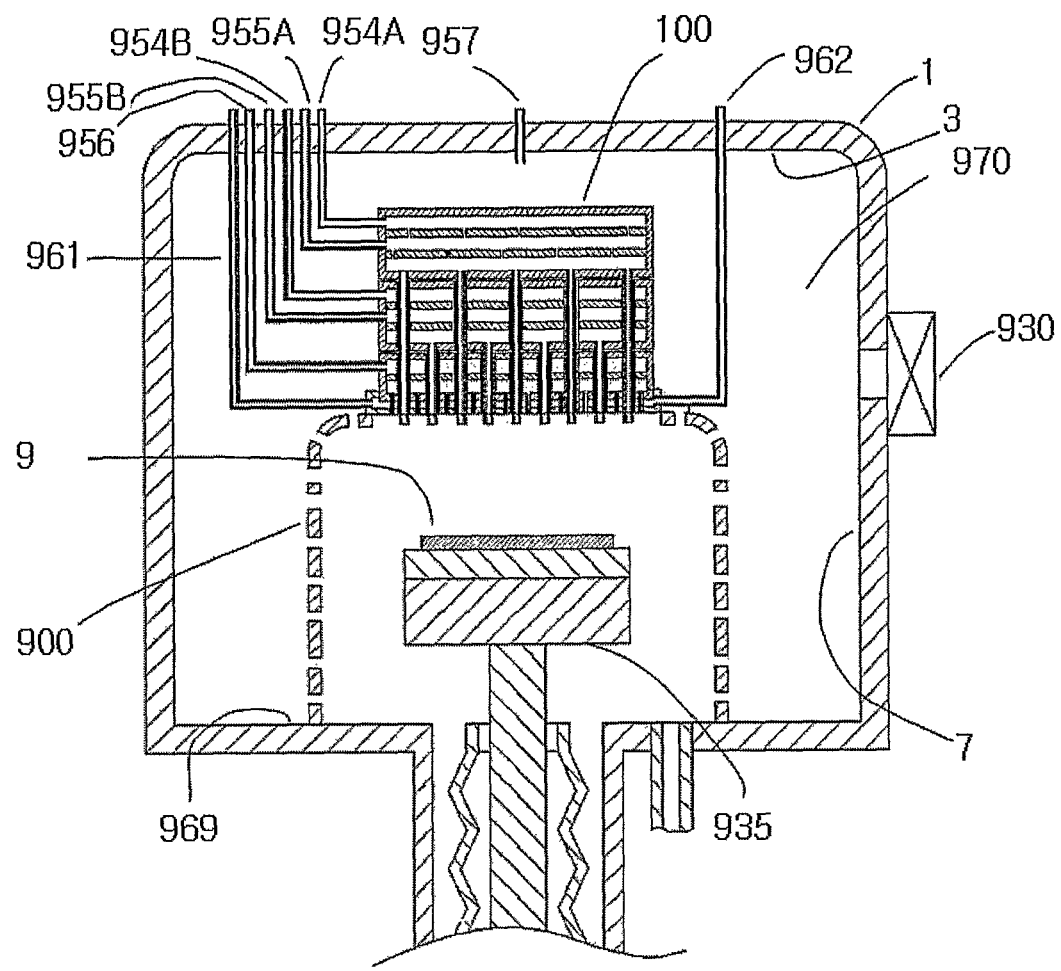
FIG. 14 is a brief sectional view showing a first example that the showerhead according to the present invention is applied to a reactive gas confining means.

FIG. 14 shows a first example that the showerhead 100 of the present invention is applied to a reactive gas confining means 900. Here, the reactive gas confining means 900 is spaced apart from the inner wall 7 and the ceiling of the reaction chamber 1 at a distance, surrounds the substrate 9 with a dome-like roof, touches the bottom 961 of the reaction chamber along its end, has a large number of fine holes formed thereon and an opening part formed at the central portion of the roof thereof on which the rim of the showerhead 100 is placed along the opening so that the bottom surface of the showerhead 100 and the substrate are in parallel to and facing each other. Details about the reactive gas confining means are incorporated in U.S. Pat. No. 7,156,921 by reference.

As shown in FIG. 14, two reactive gases, two injection support gases, and a first purge gas are delivered into the showerhead 100 through a reactive gas supply tubes 954A and 954B, injection support gas supply tubes 955A and 955B, and a first purge gas supply tube 956, respectively. A coolant enters into the showerhead 100 through a coolant supply tube 961 and goes out of the reaction chamber 1 through coolant return tube 962. And a second purge gas is delivered into a space 970 between the reaction chamber wall 7 and the reactive gas confining means 900 via the second purge gas supply port 957. Then, the reactive gas confining means 900 works to prevent unwanted particle deposition on the inner side thereof by the protective curtain effect of the second purge gas delivered from outside to inside of the reactive gas confining means 900. In addition to this, the contamination at the bottom of the showerhead is prevented by the function of the showerhead in the present invention described earlier. Moreover, the growth rate of films grown on substrates is much enhanced by the effect of the second purge gas which confines the reactive gas in the vicinity of the substrate.

EXAMPLE 2

Figure 15:
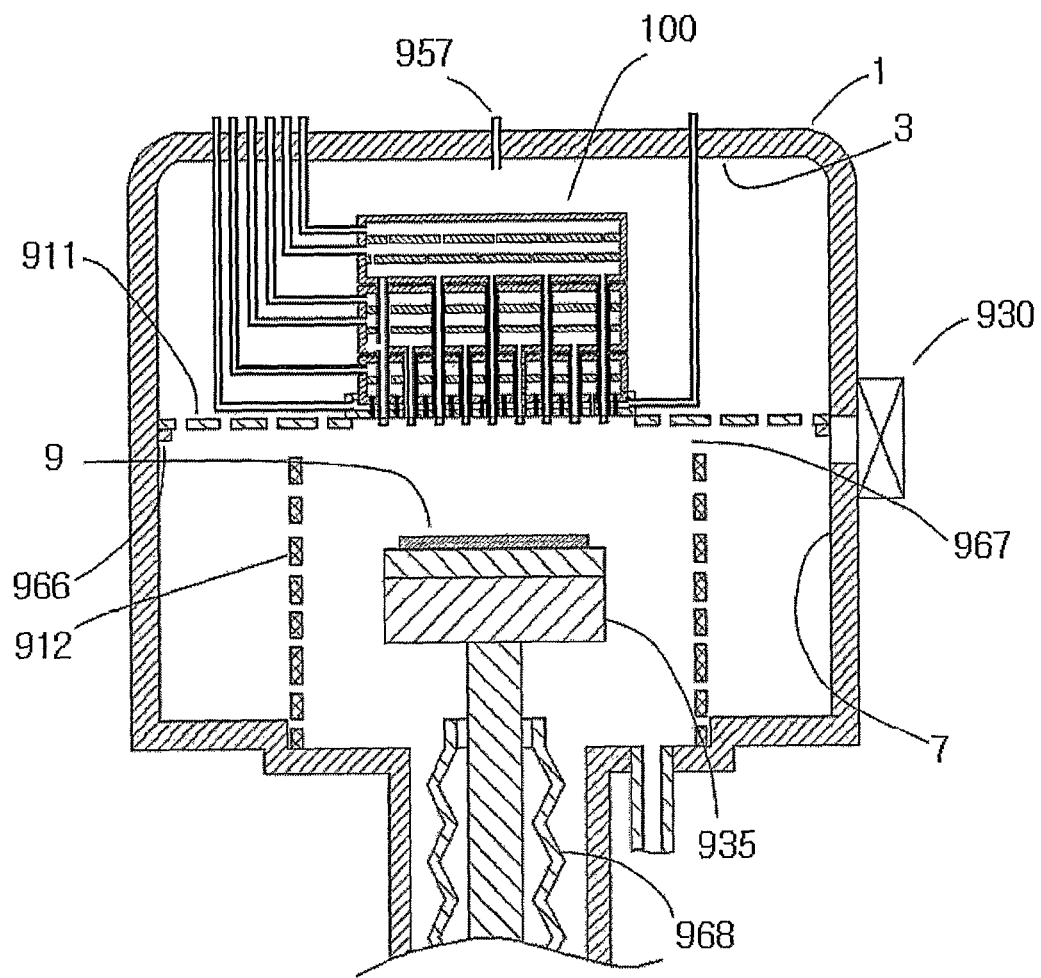
FIG. 15 is a brief sectional view showing a second example that the showerhead according to the present invention is applied to another type of a reactive gas confining means.

FIG. 15 shows a case that the showerhead 100 of the present invention is applied to a reactive gas confining means 900 of another type. Here, the reactive gas confining means 900 has a ceiling with a flat rim. The ceiling with a rim can be easily mounted on a device such as a protruded spot 966 in the reaction chamber 1. And a gap between the ceiling and the vertical wall of the reactive gas confining means could be easily formed to permit in and out of the substrate 9. As the gap 967 is opened by lowering the vertical wall 912 of the reactive gas confining means using a kind of lever (not shown) attached to the bellows 968 which is hermetically joined to the stage 935, in and out of the substrate 9 would be performed by inserting a robot arm (not shown) from a transfer chamber (not shown) to the reaction chamber 1 through a gate valve 930 and the gap 967 followed by raising and lowering of the stage 935.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

INDUSTRIAL APPLICABILITY

According the present invention, regardless of the condition whether the material is complicated to handle or the process is restrictive in CVD, thick films can be deposited without concern about the contamination of the reaction chamber including reaction chamber inner wall and showerhead. Therefore, the present invention can be effectively used as a solution in the process where unwanted films are grown on surfaces of internal parts of the reaction chamber caused by chemical reactions of reactive gases. Since the present invention comprises very simple and compatible structures, the detailed parts of the present invention can be easily adopted. For a new applicability, as the present invention is advantageous in growing PZT films as thick as 2~8☐ for inkjet head, the performance of the inkjet can be greatly enhanced and the inkjet technology can be more widely used in the deposition of electronic materials like LCD color filters. Moreover, the present invention has a wide industrial applicability including the miniaturization and high efficiency of electronic parts such as multi-layer ceramic chip condensers (MLCC).

The invention claimed is:

1. An apparatus for chemical vapor deposition (CVD) with a showerhead through which a reactive gas and a purge gas are injected over a substrate located in a reaction chamber to deposit a film on the substrate, the showerhead comprising:

a reactive gas showerhead module, equipped with a reactive gas supply port to supply the reactive gas to the inside of the reactive gas showerhead module, having a plurality of reactive gas injection tubes connected to a bottom of the reactive gas showerhead module to inject the reactive gas over the substrate through the reactive gas injection tubes;

a purge gas showerhead module, disposed below the reactive gas showerhead module, the purge gas showerhead module comprising a ceiling, a vertical wall, and a bottom plate, and equipped with a purge gas supply port to supply the purge gas to the inside of the purge gas showerhead module, the purge gas showerhead module having a plurality of guide tubes hermetically installed and extending between the ceiling and the bottom plate of the purge gas showerhead module and allowing the reactive gas injection tubes to pass through the guide tubes of the purge gas showerhead module while keeping a hermetic sealing between the purge gas showerhead module and the reactive gas injection tubes; and a cooling jacket for cooling the showerhead, the cooling jacket mounted below the purge gas showerhead module, the cooling jacket comprising a ceiling, a vertical wall, a coolant inlet port, a coolant outlet port, and a bottom, wherein said ceiling of the cooling jacket is a different element from the bottom plate of the purge gas showerhead module, and a plurality of guide tubes hermetically installed and extending between the ceiling and the bottom of the cooling jacket, with one end of each guide tube connected to the ceiling of the cooling jacket and the other end connected to the bottom of the cooling jacket, said guide tubes aligned with the guide tubes of the purge gas showerhead module and configured to receive the reactive gas injection tubes therethrough, the inner diameter of the guide tubes being larger than the outer diameter of the reactive gas injection tubes and having a gap between the guide tube and the reactive gas injection tube, wherein the showerhead is configured such that the purge gas released from the purge gas showerhead module passes through the gap between the guide tube and the reactive gas injection tube to be injected over the substrate.

2. An apparatus for chemical vapor deposition (CVD) with a showerhead as recited in claim 1, wherein the cooling jacket further includes a plurality of additional guide tubes installed between the ceiling and the bottom of the cooling jacket, so that the purge gas released from the purge gas showerhead module passes through the inside of the additional guide tubes to inject over the substrate.

3. An apparatus for chemical vapor deposition (CVD) with a showerhead as recited in claim 1 or claim 2 further comprising: a reactive gas confining means for surrounding the substrate located in the reaction chamber, the reactive gas confining means including a side wall and a ceiling, having a plurality of openings perforated on a surface thereof for communication between the inside and outside areas thereof, wherein the side wall extends to the bottom of the reaction chamber, a space having a pre-determined dimension is formed between the ceiling of the reaction chamber and the ceiling of the reactive gas confining means; a second purge gas supply port formed on the ceiling of the reaction chamber for supplying a second purge gas to the reaction chamber; and an exhaust port located at an inside area of the reactive gas confining means for discharging exhaust gases from the reaction chamber, wherein the second purge gas supplied from the second purge gas supply port flows through the space and into the reactive gas confining means via said plurality of perforated openings, whereby the flow rate of the second purge gas into the reactive gas confining means is regulated so as to prevent contamination of the reactive gas confining means and to enhance the film growth rate on the substrates by increasing the concentration of the reactive gases in the vicinity of the substrates.

4. An apparatus for chemical vapor deposition (CVD) with a showerhead as recited in claim 1 or claim 2 further comprising: a reactive gas confining means for surrounding the substrate located in the reaction chamber, the reactive gas confining means including a vertical wall and a ceiling with a rim of a flat type, having a plurality of openings perforated on a surface thereof for communication between the inside and outside areas thereof, wherein the vertical wall extends to the bottom of the reaction chamber, a space having a pre-determined dimension is formed between the ceiling of the reaction chamber and the ceiling of the reactive gas confining means, and a gap between the ceiling and the vertical wall thereof can be opened by lowering the vertical wall thereof; a second purge gas supply port formed on the ceiling of the reaction chamber for supplying a second purge gas to the reaction chamber; and an exhaust port located at an inside area of the reactive gas confining means for discharging exhaust gases from the reaction chamber, wherein the second purge gas supplied from the second purge gas supply port flows through the space and into the reactive gas confining means via said plurality of perforated openings, whereby the flow rate of the second purge gas into the reactive gas confining means is regulated so as to prevent contamination of the reactive gas confining means and to enhance the film growth rate on the substrates by increasing the concentration of the reactive gases in the vicinity of the substrates.

5. An apparatus for chemical vapor deposition (CVD) with a showerhead as recited in claim 1 or claim 2, wherein said reactive gas injection tubes extend from the bottom surface of the cooling jacket toward the substrate in a range up to 10 mm, and the end tip of the reactive gas injection tubes has a shape of a converging nozzle whose inner diameter at the exit is 0.8 to 2 mm.

6. An apparatus for chemical vapor deposition (CVD) with a showerhead as recited in claim 1 or claim 2, wherein said guide tubes of the purge gas showerhead module and said guide tubes of the cooling jacket have a substantially same inner diameter through which said reactive gas injection tube passes.

7. An apparatus for chemical vapor deposition (CVD) with a showerhead through which at least one reactive gas and a purge gas are injected over a substrate located in a reaction chamber to deposit a film on the substrate, the showerhead comprising:

an upper reactive gas showerhead module, equipped with a reactive gas supply port to supply a reactive gas to the inside of the upper reactive gas showerhead module, having a plurality of reactive gas injection tubes connected to a bottom of the upper reactive gas showerhead module to inject the reactive gas over the substrate through the reactive gas injection tubes;

a lower reactive gas showerhead module, disposed below the upper reactive gas showerhead module, the lower reactive gas showerhead module comprising a ceiling, a vertical wall, and a bottom plate, and equipped with a reactive gas supply port to supply a reactive gas to the inside of the lower reactive gas showerhead module, having a plurality of reactive gas injection tubes connected to the bottom plate of the lower reactive gas showerhead module to inject to the reactive gas over the substrate through the reactive gas injection tubes, the lower reactive gas showerhead module having a plurality of guide tubes hermetically installed and extending between the ceiling and the bottom plate of the lower reactive gas showerhead module and allowing the reactive gas injection tubes of the upper reactive gas showerhead module to pass through the guide tubes of the lower reactive gas showerhead module while keeping a hermetic sealing between the lower reactive gas showerhead module and the reactive gas injection tubes of the upper reactive gas showerhead module;

a purge gas showerhead module, disposed below the reactive gas showerhead module, the purge gas showerhead module comprising a ceiling, a vertical wall, and a bottom plate, and equipped with a purge gas supply port to supply the purge gas to the inside of the purge gas showerhead module, the purge gas showerhead module having a plurality of guide tubes hermetically installed and extending between the ceiling and the bottom plate of the purge gas showerhead module and allowing the reactive gas injection tubes to pass through the guide tubes of the purge gas showerhead module while keeping a hermetic sealing between the purge gas showerhead module and the reactive gas injection tubes; and a cooling jacket for cooling the showerhead, the cooling jacket mounted below the purge gas showerhead module, the cooling jacket comprising a ceiling, a vertical wall, a coolant inlet port, a coolant outlet port, and a bottom, wherein said ceiling of the cooling jacket is a different element from the bottom plate of the purge gas showerhead module, and a plurality of guide tubes hermetically installed and extending between the ceiling and the bottom of the cooling jacket, with one end of each guide tube connected to the ceiling of the cooling jacket and the other end connected to the bottom of the cooling jacket, said guide tubes aligned with the guide tubes of the lower reactive gas showerhead module and the purge gas showerhead module, and configured to receive the reactive gas injection tubes there-through, the inner diameter of the guide tubes being larger than the outer diameter of the reactive gas injection tubes and having a gap between the guide tube and the reactive gas injection tube, wherein the showerhead is configured such that the purge gas released from the purge gas showerhead module passes through the gap between the guide tube and the reactive gas injection tube to be injected over the substrate.

8. An apparatus for chemical vapor deposition (CVD) with a showerhead as recited in claim 7, wherein said guide tubes of the lower reactive gas showerhead module, said guide tubes of the purge gas showerhead module and said guide tubes of the cooling jacket have a substantially same inner diameter through which said reactive gas injection tube passes.

* * * * *